United States Patent
Zhang

(10) Patent No.: US 11,693,150 B2
(45) Date of Patent: Jul. 4, 2023

(54) COORDINATE-RELATED DESPIKING OF HYDROCARBON RESERVOIR DATA

(71) Applicant: Saudi Arabian Oil Company, Dhahran (SA)

(72) Inventor: Xingquan Zhang, Dhahran (SA)

(73) Assignee: Saudi Arabian Oil Company, Dhahran (SA)

(*) Notice: Subject to any disclaimer, the term of this patent is extended or adjusted under 35 U.S.C. 154(b) by 251 days.

(21) Appl. No.: 17/066,085

(22) Filed: Oct. 8, 2020

(65) Prior Publication Data
US 2022/0113445 A1    Apr. 14, 2022

(51) Int. Cl.
G01V 99/00    (2009.01)
G06F 30/23    (2020.01)

(52) U.S. Cl.
CPC ...... G01V 99/005 (2013.01); *G01V 2210/665* (2013.01); *G06F 30/23* (2020.01)

(58) Field of Classification Search
CPC ............. G01V 99/005; G01V 99/00; G01V 2210/665; G06F 30/23
See application file for complete search history.

(56) References Cited

U.S. PATENT DOCUMENTS

| | | | |
|---|---|---|---|
| 5,850,560 A * | 12/1998 | Kang | G06F 1/32 713/324 |
| 5,995,906 A | 11/1999 | Doyen et al. | |
| 6,490,526 B2 | 12/2002 | Matteucci et al. | |
| 9,355,070 B2 | 5/2016 | Thorne | |
| 9,448,313 B2 | 9/2016 | Hofland et al. | |
| 9,817,143 B2 | 11/2017 | Groenestijn | |
| 9,959,144 B2 * | 5/2018 | Callegari | G06F 9/5044 |
| 10,061,046 B2 | 8/2018 | Hofland et al. | |
| 2006/0241920 A1 | 10/2006 | Le Ravalec-Dupin | |

(Continued)

FOREIGN PATENT DOCUMENTS

WO    WO 2020142257    7/2020

OTHER PUBLICATIONS

Bourgault, G. "Using Non-Gaussian Distributions in Geostatistical Simulations" Mathematical Geology, vol. 29, No. 3, pp. 315-334 (1997) (Year: 1997).*

(Continued)

*Primary Examiner* — Jay Hann
(74) *Attorney, Agent, or Firm* — Fish & Richardson P.C.

(57) ABSTRACT

Methods for coordinate-related despiking of hydrocarbon reservoir data include receiving, by a computer system, multiple datapoints of a geomechanical property of a hydrocarbon reservoir modeled by a three-dimensional (3D) grid. Each datapoint corresponds to 3D coordinates of the 3D grid. For each datapoint, the computer system aggregates the datapoint with a noise component generated using the 3D coordinates corresponding to the datapoint. The computer system determines that the aggregated datapoint is unique to the multiple datapoints. The computer system performs a transform on the datapoints for Gaussian simulation. A display device of the computer system generates a graphical representation of the geomechanical property of the hydrocarbon reservoir based on the Gaussian simulation of the transformed datapoints.

20 Claims, 10 Drawing Sheets

(56) References Cited

U.S. PATENT DOCUMENTS

2016/0146973 A1* 5/2016 Johnson ............... G01V 99/005 702/2
2018/0275301 A1 9/2018 Ma et al.
2021/0238962 A1 8/2021 Zhang

OTHER PUBLICATIONS

Deutsch, C.V. & Journel, A.G., "GSLIB: Geostatistical Software Library and User's Guide" Oxford University Press, New York, second edition (1997) (Year: 1997).*

Zhang, J., et al. "Geostatistics for Spatial Uncertainty Characterization" Geo-spatial Information Science, vol. 12, issue 1, pp. 7-12 (2009) (Year: 2009).*

Emery et al., "Histogram and variogram inference in the multigaussian model," Stochastic environmental research and risk assessment, Feb. 2005, 19(1):48-58, 11 pages.

Prades et al., "Geostatistics and clustering for geochemical data analysis," Thesis submitted in partial fulfillment of the requirement for the degree of Master of Science in Mining Engineering, University of Alberta, 2017, 96 pages.

Qu et al., "Geostatistical simulation with a trend using gaussian mixture models," Natural Resources Research, Aug. 2017, 27(3):347-363, 17 pages.

PCT International Search Report and Written Opinion in International Appln. No. PCT/US2021/053742, dated Jan. 28, 2022, 13 pages.

Basarir et al., "Geostatistical modeling of spatial variability of SPT data for a borax stockpile site," Engineering Geology, 2010, 114: 154-163, 10 pages.

U.S. Appl. No. 16/780,196, filed Feb. 3, 2020, Zhang et al.

Pyrcz and Deutsch, Geo statistical Reservoir Modeling, 2nd Edition, Oxford University Press, New York, 2014, p. 49-53.

Kerry et al., "Determining the effect of asymmetric data on the variogram. I. Underlying asymmetry," Computers & Geosciences, Oct. 2007, 33(10): 1212-1232, 21 pages.

PCT International Search Report and Written Opinion in International Appln. No. PCT/US20201/016312, dated Jun. 30, 2021, 17 pages.

* cited by examiner

Receive, by a computer system, multiple datapoints of a geomechanical property of a hydrocarbon reservoir modeled by a three-dimensional (3D) grid, each datapoint corresponding to 3D coordinates of the 3D grid
1204

For each datapoint, aggregate, by the computer system, the datapoint with a random component generated using the 3D coordinates corresponding to the datapoint
1208

Determine, by the computer system, that the aggregated datapoint is unique to the datapoints
1212

Perform, by the computer system, a transform on the multiple datapoints for Gaussian simulation
1216

Generate, by a display device of the computer system, a graphical representation of the geomechanical property of the hydrocarbon reservoir based on the Gaussian simulation of the transformed datapoints
1220

FIG. 12

COORDINATE-RELATED DESPIKING OF HYDROCARBON RESERVOIR DATA

TECHNICAL FIELD

This description relates generally to hydrocarbon reservoirs, for example, to coordinate-related despiking of hydrocarbon reservoir data.

BACKGROUND

Hydrocarbon reservoir modeling and simulation can pose several challenges. The input hydrocarbon reservoir property data can include a number of spikes or vertical jumps in the distribution because of a large number of similar values. Hydrocarbon reservoir modeling using input data distributions having spikes or vertical jumps can lead to inaccurate simulation and prediction of geomechanical properties of a reservoir.

SUMMARY

Methods for coordinate-related despiking of hydrocarbon reservoir data include receiving, by a computer system, multiple datapoints of a geomechanical property of a hydrocarbon reservoir modeled by a three-dimensional (3D) grid. Each datapoint corresponds to 3D coordinates of the 3D grid. For each datapoint, the computer system aggregates the datapoint with a noise component generated using the 3D coordinates corresponding to the datapoint. The computer system determines that the aggregated datapoint is unique to the multiple datapoints. The computer system performs a transform on the datapoints for Gaussian simulation. A display device of the computer system generates a graphical representation of the geomechanical property of the hydrocarbon reservoir based on the Gaussian simulation of the transformed datapoints.

In some implementations, each of a mean, a standard deviation, and a variogram of the plurality of datapoints are unchanged by the aggregation of the plurality of datapoints with the noise component.

In some implementations, the computer system generates the noise component using a column index, a row index, and a layer index of the 3D coordinates of the 3D grid.

In some implementations, generating the noise component includes multiplying, by the computer system, the column index, the row index, and the layer index with random coefficients selected to avoid matching values of the column index, the row index, and the layer index.

In some implementations, performing the transform includes ranking, by the computer system, each datapoint with a rank within a Gaussian distribution. The computer system assigns each datapoint to a value of the geomechanical property based on the rank.

In some implementations, the computer system removes the noise component prior to the Gaussian simulation to provide the geomechanical property at locations of the hydrocarbon reservoir.

In some implementations, the computer system converts the datapoints to a 64-bit double-precision floating point format prior to aggregating each datapoint with the noise component.

BRIEF DESCRIPTION OF THE DRAWINGS

FIG. 12 illustrates a process for coordinate-related despiking of hydrocarbon reservoir data, in accordance with one or more implementations.

DETAILED DESCRIPTION

The implementations disclosed provide methods, apparatus, and systems for coordinate-related despiking of hydrocarbon reservoir data. The transformation of the hydrocarbon reservoir data to a standard normal distribution using normal score transform (NST) involves use of a graphical one-to-one (rank preserving) transform. Using the implementations disclosed herein, tied values in the hydrocarbon reservoir data are avoided, which can create "spikes" in the transformed NST histogram and lead to imperfect statistical reproduction or histogram reproduction in a simulation model. Despiking is thus implemented to remove tied values in the hydrocarbon reservoir data. Using the implementations disclosed herein, a suite of Python programs were developed to perform coordinate-related despiking related to NST and to transform the simulation model back to the original scale. The input histogram was optimally reproduced even when a large number of tied values were present in the hydrocarbon reservoir data.

Among other benefits and advantages, the methods provide a flexible and integrated framework for coordinate-related despiking of hydrocarbon reservoir data. The implementations disclosed. The implementations enable despiking of the input data without the need for external tools or programming. The coordinate-related despiking of hydrocarbon reservoir data used can be applied to any continuous reservoir geomechanical property variable that requires a Gaussian score transformation. The random data is removed from the geostatistical simulation model automatically, such that the original input data is not impacted. The implementations can be applied to a large number of spiked data values. The implementations reduce the computation time for despiking the input data, such that when three-dimensional (3D) coordinate-related despiking of hydrocarbon reservoir data is used, the NST process takes on the order of seconds. Therefore, using the disclosed implementations, a large geological model having multiple facies and zones can be processed with reduced computation time.

Figure 1:
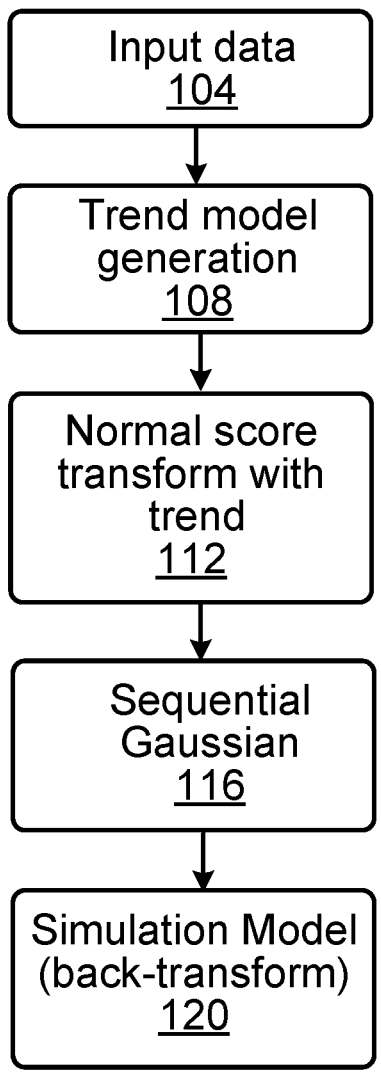
FIG. 1 illustrates a process for Sequential Gaussian Simulation (SGS), in accordance with one or more implementations.

FIG. 1 illustrates a process for Sequential Gaussian Simulation (SGS), in accordance with one or more implementations. In some implementations, the process is performed by the computer system illustrated and described in more detail with reference to FIG. 13.

The computer system receives (104) multiple datapoints of a geomechanical property of a hydrocarbon reservoir modeled by a three-dimensional (3D) grid. Each datapoint corresponds to 3D coordinates of the 3D grid. An oil reservoir or hydrocarbon reservoir refers to a subsurface pool of hydrocarbons contained in porous or fractured rock formations. A hydrocarbon well refers to a boring in the Earth that is designed to bring petroleum oil hydrocarbons and natural gas to the surface. Multiple hydrocarbon wells can be bored in a reservoir. A porosity distribution (datapoints of a geomechanical property of the hydrocarbon reservoir) can be used. Geostatistical algorithms can use a Gaussian distribution of multiple datapoints of the geomechanical property of a hydrocarbon reservoir for probabilistic prediction of continuous reservoir properties. The probabilistic prediction of continuous reservoir properties can be used for constructing, for example, a stochastic porosity model to an amount of the original oil in place (OOIP) during a reservoir exploration stage as well as a reservoir development stage.

The computer system generates (108) a trend model using a reservoir modeling system. The trend model can be related to coordinates of grid cells of a three-dimensional (3D) grid. The hydrocarbon reservoir is modeled by a 3D grid and each datapoint corresponds to a respective grid cell of the 3D grid. Spiked values within the multiple datapoints can be clustered in space. Because non-pay facies, such as shales, are sometimes not analyzed or have inadequate core samples for analysis, a value of 0.0 can be assigned to the effective porosity of shales. Similarly, datapoints are sometimes "cleaned up" by the use of a constraint. For example, an effective water saturation below the oil-water contact level is set to all 1.0s. As the result, spikes are observed to be laterally controlled by lithologies or vertically controlled by oil-water contact. Thus, spiked values in the multiple datapoints of the geomechanical property of the hydrocarbon reservoir are often spatially adjacent. Each grid cell of the 3D grid is represented by 3D coordinates, for example, a row number J, a column number I, and a layer number K.

The computer system performs (112) a normal score transform (NST) using a coordinate-related trend from the trend model. The NST is applied to the multiple datapoints of the geomechanical property of the hydrocarbon reservoir. The NST can include a quantile-to-quantile process performed by the computer system. For example, if the datapoints of the geomechanical property of the hydrocarbon reservoir are not Gaussian distributed, the computer system transforms the datapoints of the geomechanical property into a Gaussian distribution. A quantile-to-quantile NST can be used to convert an arbitrary distribution to a standard normal distribution. The NST method matches a quantile of the data distribution (the multiple datapoints of the geomechanical property of the hydrocarbon reservoir) to the same quantile of the standard normal distribution. Each datapoint is transformed to a normal score value that indicates a number of standard deviations that the observation (datapoint) is above or below a mean value.

The computer system performs (116) the SGS on the datapoints. The SGS algorithm used for simulating the geomechanical property of the hydrocarbon reservoir based on the transformed distribution generates a smaller percentage of the spiked values. SGS is used for stochastic characterization of the geomechanical properties of the hydrocarbon reservoir. For example, if 20% of the original set of porosity datapoints has zeros (0s), the simulation model will generate fewer zero values, such as 15%. The mean of the porosity model increases, resulting in higher pore volume estimates. Similarly, if spikes occur at the maximum datapoint value, the mean of the simulation model decreases. Removing spiked values are therefore important for reproducing the input histogram correctly. For example, for a hydrocarbon reservoir model having a billion barrels of reserve, a 1% pore volume change can equal tons of hydrocarbons.

The computer system performs (120) a back-transform, for example, by down-scaling the simulation results of the geomechanical property to the original scale. Down-scaling is the process to back-transform the simulated Gaussian values to their original data scale. The down-scaling changes the values, for example, from double-precision decimals to single-precision decimals.

Figure 2A:
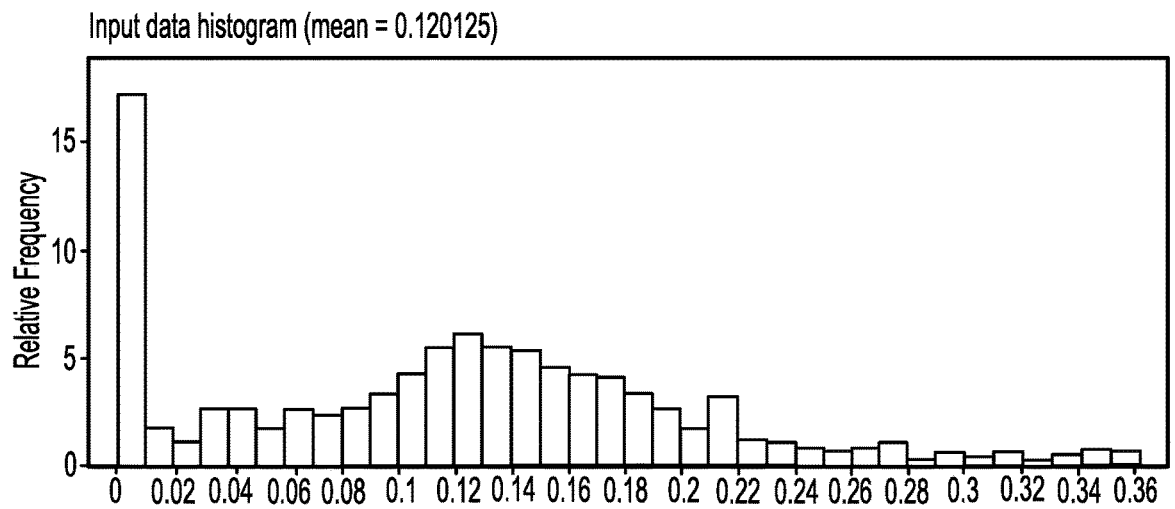
FIG. 2A illustrates an example input data histogram, in accordance with one or more implementations.

FIG. 2A illustrates an example input data histogram, in accordance with one or more implementations. The datapoint values shown in the example input data histogram have a mean of 0.120125. For example, without the use of special programming tools, a trend model (coordinate-based) is generated to break any tied values in the input dataset, as illustrated and described in more detail with reference to FIG. 1. A normal-score histogram can be generated, however the trend can also change the input data mean, especially if the percentage of the spiked values is large. A benefit of this solution is that no additional programming is required, however, the results can depend on how the geomodeling package handles the trend model.

Figure 2B:
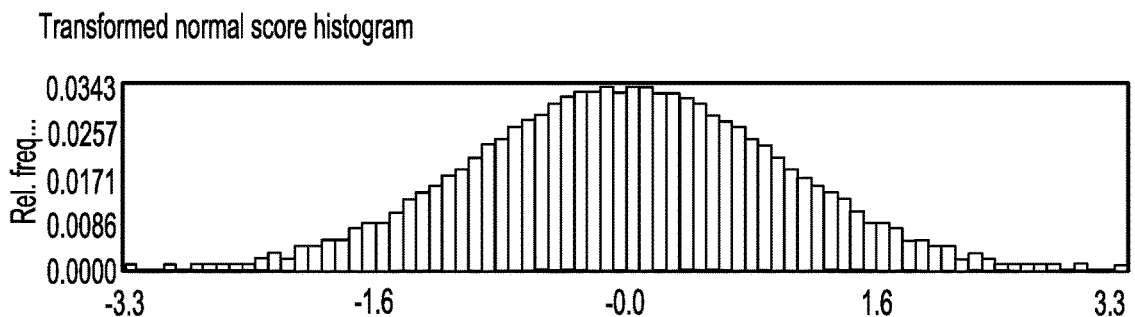
FIG. 2B illustrates a transformed normal-score histogram, in accordance with one or more implementations.

FIG. 2B illustrates a transformed normal-score histogram, in accordance with one or more implementations. Using the methods illustrated and described in more detail with reference to FIG. 1, an NST is used to transform the set of datapoints into a Gaussian distribution, such that the set of datapoints resembles a standard normal distribution. In some implementations, transforming the set of datapoints includes ranking each datapoint of the set of datapoints with a rank within the Gaussian distribution. For example, in a quantile-to-quantile NST procedure, the computer system sorts and ranks the set of datapoints.

Figure 2C:
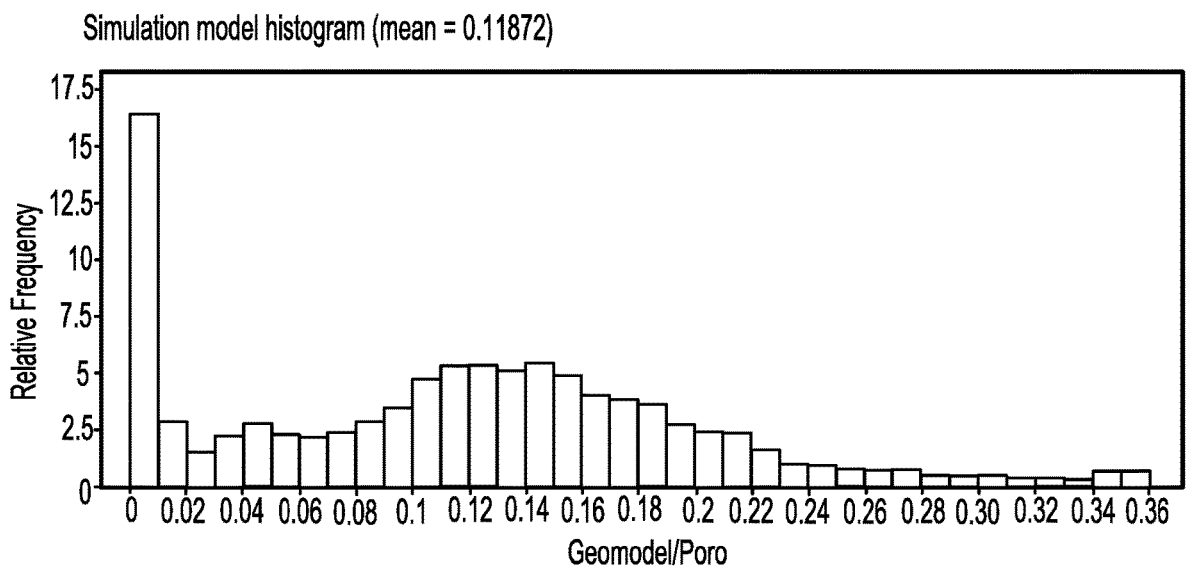
FIG. 2C illustrates a simulation model histogram, in accordance with one or more implementations.

FIG. 2C illustrates a simulation-model histogram, in accordance with one or more implementations. The simulation-model histogram shown in FIG. 2C has a mean value of 0.11872 and is generated using the methods illustrated and described in more detail with reference to FIG.

Figure 3:
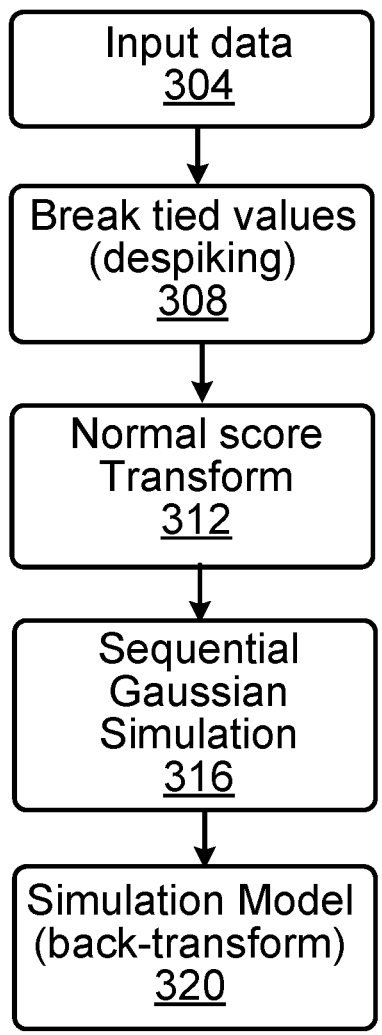
FIG. 3 illustrates a process for SGS, in accordance with one or more implementations.

FIG. 3 illustrates a process for SGS, in accordance with one or more implementations. In some implementations, the process is performed by the computer system illustrated and described in more detail with reference to FIG. 13.

The computer system receives (304) multiple datapoints of a geomechanical property of a hydrocarbon reservoir modeled by a 3D grid. Each datapoint corresponds to 3D coordinates of the 3D grid, as illustrated and described in more detail with reference to FIG. 1. A porosity distribution (datapoints of a geomechanical property of the hydrocarbon reservoir) can be used.

The computer system breaks (308) tied values in the multiple datapoints since tied values can create "spikes" on the transformed normal-score histogram and lead to suboptimal statistical reproduction and histogram reproduction on the simulation model. Unlike the process shown in FIG. 1, which adds a trend component to the NST, a set of Python programs are developed to perform the despiking directly (avoiding use of a geomodeling package). In some implementations, for each datapoint, the computer system aggregates the datapoint with a noise component generated using the 3D coordinates corresponding to the datapoint. For example, noise values are generated based on data value coordinates in a random or pseudorandom manner. The input data mean can thus be optimally reproduced on the simulation model. When the random seed number is fixed, the noise generated can be readily deduced from the simulation model for at least two reasons. First, the coordinate of each input datapoint are known. Second, the noise sequence is fixed.

The computer system performs (312) a transform, (for example, an NST) on the datapoints for Gaussian simulation. Hence, the methods and systems disclosed herein can be used for despiking the dataset used in the NST as well as a back-transform. In particular, the methods more effectively and efficiently create a normal distribution used as input for SGS. The process shown in FIG. 3 can break any number of tied values, making every sample value distinct. Moreover, the method does not significantly change the statistical distribution of the original dataset, and the method does not introduce any additional apparent trend components.

The computer system performs (316) the SGS on the datapoints, as illustrated and described in more detail with reference to FIG. 1. The SGS algorithm used for simulating the geomechanical property of the hydrocarbon reservoir based on the transformed distribution generates a smaller percentage of the spiked values. The computer system performs (220) a back-transform, for example, by down-scaling the simulation results of the geomechanical property to the original scale, as illustrated and described in more detail with reference to FIG. 1. Down-scaling is the process to back-transform the simulated Gaussian values to their original data scale.

Figure 4:
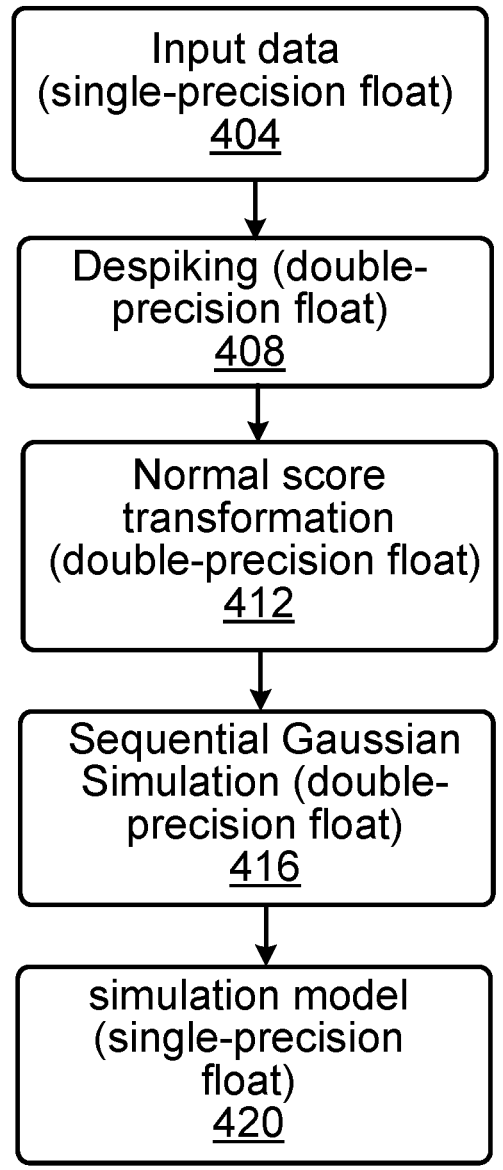
FIG. 4 illustrates changes in data precision through the SGS simulation, in accordance with one or more implementations.

FIG. 4 illustrates changes in data precision through the SGS simulation, in accordance with one or more implementations. In some implementations, the process is performed by the computer system illustrated and described in more detail with reference to FIG. 13.

The computer system receives (404) multiple datapoints of a geomechanical property of a hydrocarbon reservoir modeled by a 3D grid. The input datapoints are in a single-precision floating point format. The data precision in the SGS process does not remain the same. In particular, the data precision changes during the SGS process shown in FIG. 4 improves the accuracy preservation at each stage in FIG. 4. The hydrocarbon reservoir property values (input data) are sometimes preserved using a 32-bit floating point type or a single-precision floating point format. For example, the floating point precision can be 1.1920929e-07. The number of decimal points preserved is 7 digits. Such precision is adequate to preserve the accuracy of common reservoir properties, such as porosity.

The computer system performs (404) de-spiking of the multiple datapoints of the geomechanical property of the hydrocarbon reservoir. In some implementations, the computer system converts the datapoints to a 64-bit double-precision floating point format prior to aggregating each datapoint with the noise component. The 64-bit floating point format or double-precision floating values are used in de-spiking, performing the NST, and the SGS. For example, the floating point precision achieved is 2.2204460-49250313e-16. Hence, the number of decimal points preserved is 15 digits. Among others, a reason that double precision is used is that normal scores can be close when the number of input data values is large. Therefore, a higher data precision is used to avoid generating tied normal scores.

The computer system performs (412) a transform, (for example, an NST) on the datapoints for Gaussian simulation, as illustrated and described in more detail with reference to FIG. 3. The 64-bit floating point format or double-precision floating values are used in performing the NST. The computer system performs (416) the SGS on the datapoints, as illustrated and described in more detail with reference to FIGS. 1 and 3. Compared to traditional methods, the process shown in FIG. 4 improves the mean reproduction precision from the second decimal place to the third decimal place. For a large oilfield, the improvement provided by the disclosed implementations results in millions barrels of reserve differences. The variation in the mean addresses uncertainty in the process. For example, with generation of an optimal Gaussian field, the mean is reproduced to match the input data. The 64-bit floating point format or double-precision floating values are used in performing the SGS. The computer system performs (420) a back-transform, for example, by down-scaling the simulation results of the geomechanical property to the original scale, as illustrated and described in more detail with reference to FIGS. 1 and 3. The 32-bit floating point format or double-precision floating values are used in performing the back-transform.

Figure 5:
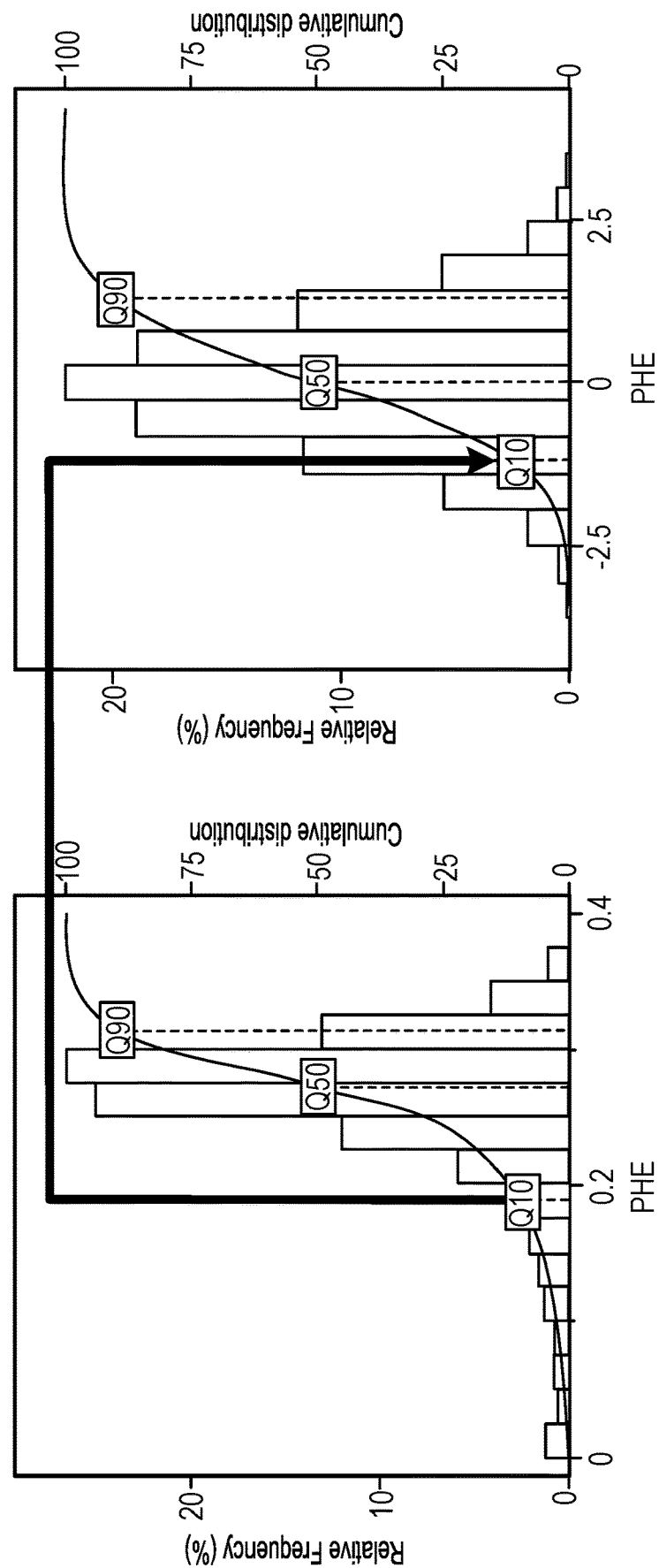
FIG. 5 illustrates an example quantile-to-quantile NST process, in accordance with one or more implementations.

FIG. 5 illustrates an example quantile-to-quantile NST process, in accordance with one or more implementations. The schematic shown in FIG. 5 illustrates an original porosity distribution on the left and a transformed porosity distribution on the right. In some implementations, the computer system assigns each datapoint to a value of the geomechanical property based on the rank. For example, an equivalent rank from a standard normal distribution is found for each rank from the set of datapoints. The normal distribution values associated with the equivalent ranks from the standard normal distribution are used to generate the transformed dataset (the Gaussian distribution). A quantile-to-quantile NST matches a p-quantile of the data distribution (augmented set of datapoints) to a p-quantile of the standard normal distribution (Gaussian distribution). The input distribution is thus transformed to the standard normal distribution. Each datapoint $z_i$ is transformed to a unique normal score value $y_i$ that indicates a number of standard deviations that the datapoint is above or below a mean value.

In some implementations, the Gaussian approximation is based on Gaussian kernels or multiplicative skewing. For example, geostatistical analysis can be performed using direct Gaussian approximation, linear Gaussian approximation, Gaussian kernels, or multiplicative skewing. Direct Gaussian approximation and linear Gaussian approximation use an observed cumulative distribution of the augmented set of datapoints into a Gaussian distribution. A Gaussian kernel transforms a dot product in the augmented set of datapoints into a Gaussian function of a distance between datapoints in the augmented set of datapoints. Multiplicative skewing approximates a cumulative distribution by fitting the augmented set of datapoints that is then skewed by a transformation.

Figure 6:
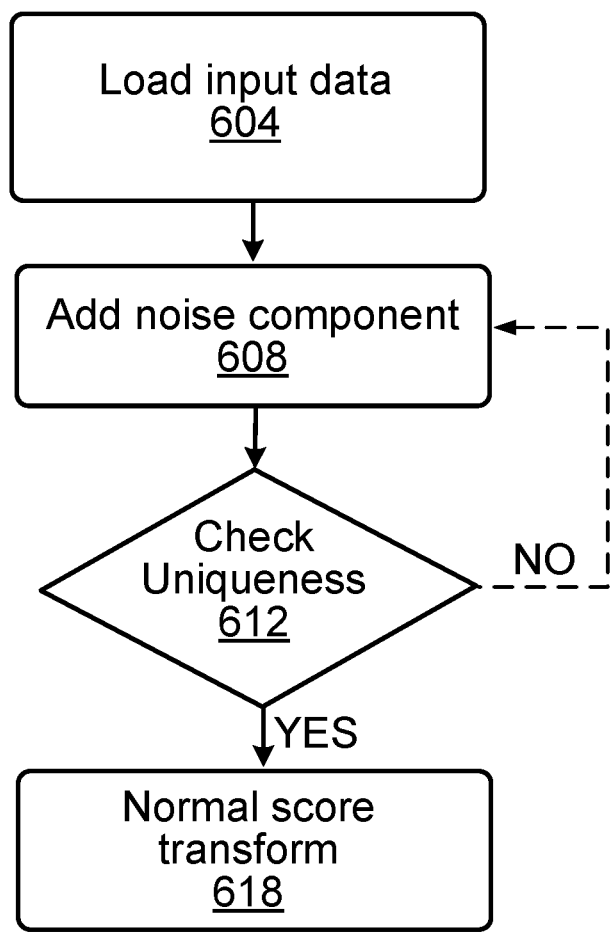
FIG. 6 illustrates a process for coordinate-related despiking of hydrocarbon reservoir data, in accordance with one or more implementations.

FIG. 6 illustrates a process for coordinate-related despiking of hydrocarbon reservoir data, in accordance with one or more implementations. In some implementations, the process is performed by the computer system illustrated and described in more detail with reference to FIG. 13.

The computer system receives (604) multiple datapoints of a geomechanical property of a hydrocarbon reservoir modeled by a three-dimensional (3D) grid. Each datapoint corresponds to 3D coordinates of the 3D grid. For example, a porosity distribution (datapoints of a geomechanical property of the hydrocarbon reservoir) can be used. The simulated continuous reservoir properties can be used for constructing, for example, a stochastic porosity model for reservoir exploration. The process of FIG. 6 uses the data precision changes shown in FIG. 4. A noise component is aggregated with each input datapoint to break any potential tied values (see FIG. 6). The noise component is small enough to avoid changing the intrinsic features of the input data set, such as the mean, standard deviation and variogram. The variogram refers to a description of the spatial continuity of the datapoints. The variogram is a discrete function calculated using a measure of variability between pairs of points at various distances. Moreover, the noise component does not introduce additional features to the input data, such as a trend.

For each datapoint of the multiple datapoints, the computer system aggregates (608) the datapoint with a noise component generated using the 3D coordinates corresponding to the datapoint. In some implementations, the component noise is generated based on the coordinates. In other implementations, the noise component is random or pseudorandom. For example, equation (1) can be used to determine the noise component as follows.

$$N=(a \times I+b \times J+c \times K) \times 10^{-d} \times V_{random} \quad (1)$$

Here, N represents the noise component and [I,J,K] represent a column index, a row index, and a layer index (3D coordinates) of each grid cell. The coefficient d is selected, such that each of a mean, a standard deviation, and a variogram of the multiple datapoints are unchanged by the aggregation of the datapoints with the noise component. For example, the scale of the maximum noise component value is set to a scale of $10^{-5}$ to $10^{-7}$, depending on the number of datapoints in the input dataset.

In some implementations, generating the noise component N comprises multiplying, by the computer system, the column index I, the row index J, and the layer index K with random coefficients selected to avoid matching values of the column index, the row index, and the layer index. For example, the coefficients a, b, and c can be randomly drawn from (0,1) to avoid tied (I+J+K) values. The value of $V_{random}$ is a random number drawn from (0, 1). When the number of tied values is large, the scaling factor d is increased, in order to create monotone dataset.

The computer system determines (612) that the aggregated datapoint is unique to the multiple datapoints. Two Python programs were developed to implement the process of FIG. 6. The first program was developed to break tied values by adding a coordinate-based noise component to each input data value and to perform an NST, that is, to transform each input data value to a normal score value. The second program was developed to transform the simulated model back to its original scale using a normal score back-transform and to remove the noise component. Because the noise component generated is coordinate-related, it can be readily removed. If the aggregated datapoint is not unique to the multiple datapoints, the computer system returns to step 608 and aggregates the datapoint with a different noise component generated using the 3D coordinates corresponding to the datapoint.

The computer system performs (618) a transform on the multiple datapoints for Gaussian simulation. For example, an NST is performed using a coordinate-related trend from the trend model. The NST is applied to the multiple datapoints of the geomechanical property of the hydrocarbon reservoir. Each datapoint is transformed to a normal score value that indicates a number of standard deviations that the observation (datapoint) is above or below a mean value. In some implementations, the computer system removes the noise component prior to the Gaussian simulation to provide the geomechanical property at multiple locations of the hydrocarbon reservoir. The process of FIG. 6 thus breaks the tied values without significantly changing the mean. The input data is first changed from a single floating point format to a double floating point format. A coordinate-related random component is aggregated with each input datapoint. The modified input dataset is used for NST. After simulation, the noise component can be removed since it is coordinate-related. Moreover, the process is operable for very large datasets, for example, having 109 to 1010 data values, because of the significant difference between the double-precision floating point and single-precision floating point formats. In some implementations, the process of FIG. 6 omits use of SGS. The process thus can work with any sequential Gaussian simulation program, which can generate a Gaussian field.

In some implementations, performing the transform includes ranking, by the computer system, each datapoint with a rank within a Gaussian distribution. The computer system assigns each datapoint to a value of the geomechanical property based on the rank. For example, to perform the quantile-to-quantile NST, the input dataset is sorted and ranked. The equivalent rank from a standard normal distribution is found for each rank from the dataset. The standard normal distribution values associated with those ranks make up the transformed dataset. Thus, the quantile-to-quantile NST matches the p-quantile of the data distribution to the p-quantile of the standard normal distribution. The transform forces any input distribution to the standard normal distribution. Each data value $z_i$ is transformed to a unique normal score value $y_i$, which indicates a number of standard deviations the observation is less than or greater than the mean.

Figure 7:
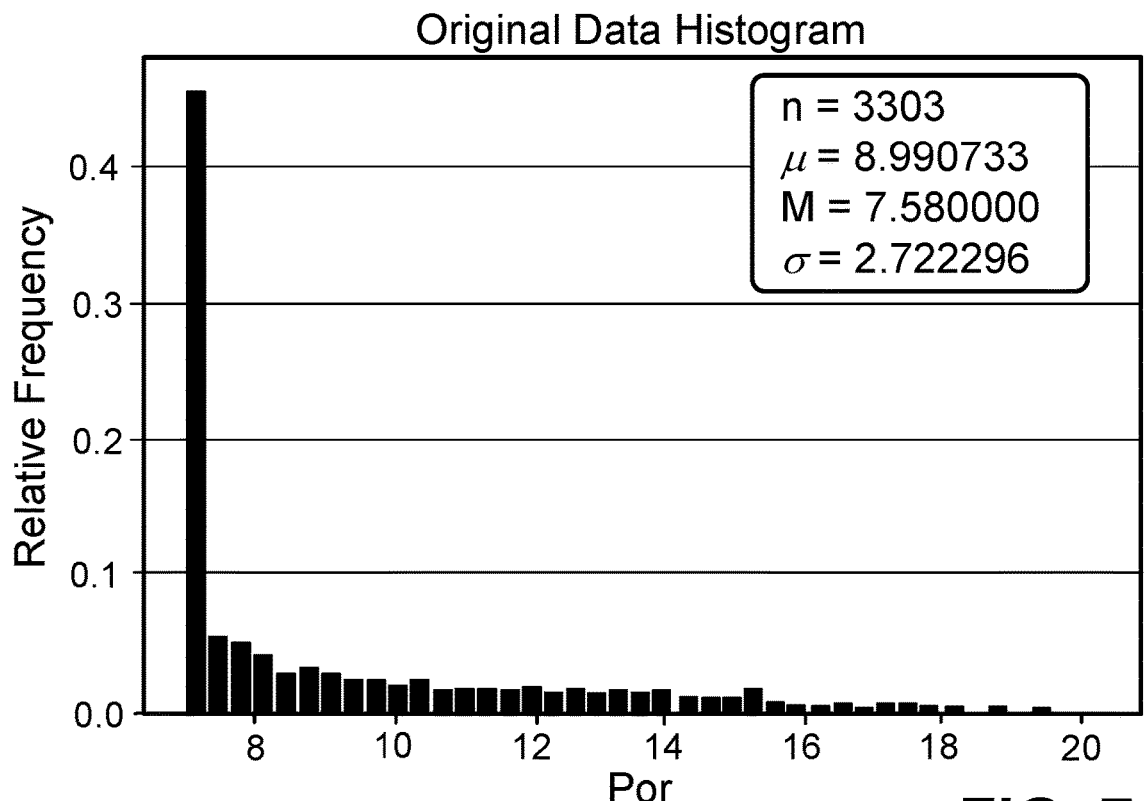
FIG. 7 illustrates an example input data histogram, in accordance with one or more implementations.

FIG. 7 illustrates an example input data histogram, in accordance with one or more implementations. The Python programs, described in more detail with reference to FIG. 6, were tested with the example input dataset of FIG. 7. The example input dataset contains porosity logs of 62 vertical wells from a clastic reservoir; the values are expressed as a percentage of the maximum value. A minimum porosity value was set to 7.0 to create a highly spiked dataset. The example input dataset contains 3303 values having 2551 tied values (77.23%). The example input dataset has a mean of 8.990732667272177, a median of 7.58, and a standard deviation of 2.722295897243374.

Figure 8:
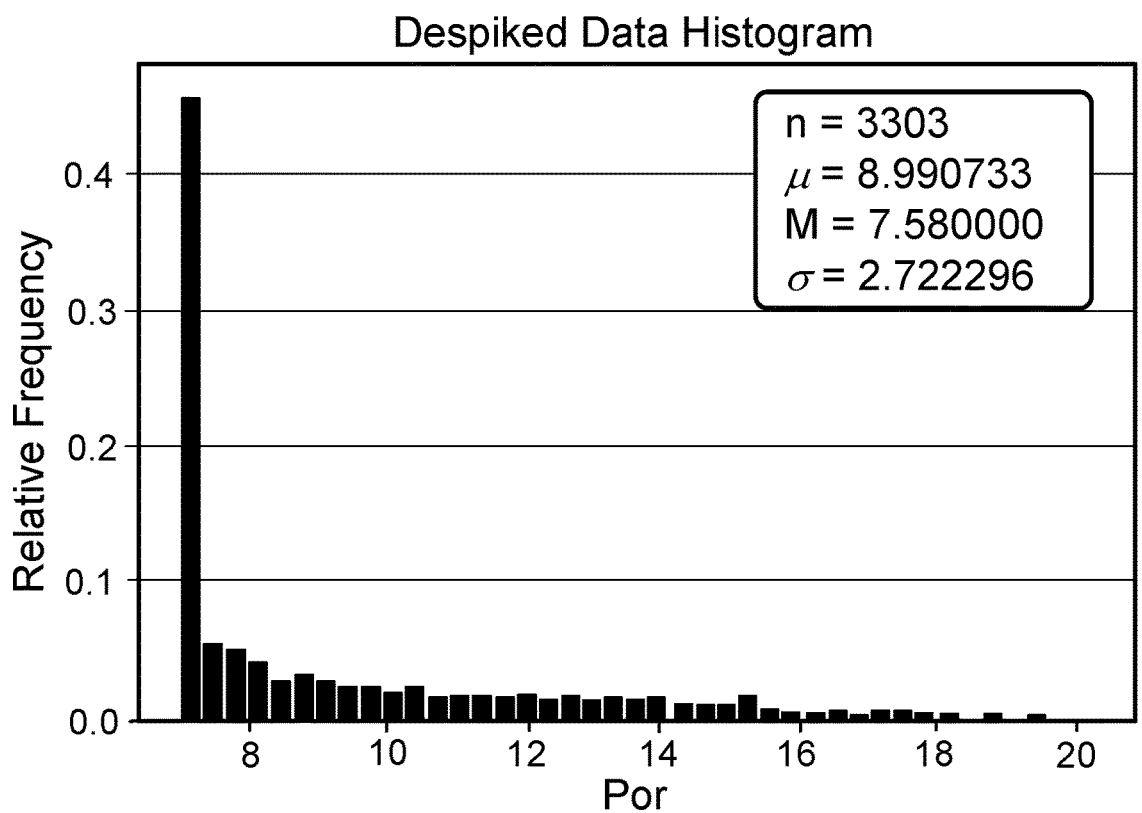
FIG. 8 illustrates an example histogram of a de-spiked dataset, in accordance with one or more implementations.

FIG. 8 illustrates an example histogram of a de-spiked dataset, in accordance with one or more implementations. The process illustrated and described in more detail with reference to FIG. 6 was applied to the example input dataset of FIG. 7 to break the tied values. The histogram of the resulting dataset is shown in FIG. 8. Changes to the statistics of the input data are negligible to none. In some implementations, each of a mean, a standard deviation, and a variogram of the datapoints are unchanged by the aggregation of the datapoints with the noise component. The resulting dataset of FIG. 8 contains 3303 values having 0 tied values. The resulting dataset of FIG. 8 has a mean of 8.990732667272177, a median of 7.58, and a standard deviation of 2.722295897243374.

The results of the process of FIG. 6 when examined in FIG. 8 thus lead to continuous variable histogram reproduction simulated with SGS algorithm, such as porosity and permeability, even when the input dataset is highly spiked. Sometimes, a large amount of zeros appear in the input dataset in effective porosity data because of the physical meaning of porosity in shale. Geostatistical simulation algorithm typically produce a smaller percentage of zeros, and as a result, the model porosity mean is greater than the input data. Hence, the pore volume increases. This can occur because of the influence of spiked values. Using the process of FIG. 6, a coordinate-related noise component is added to the original input dataset. The noise is small enough to avoid impacting the intrinsic features of the original dataset, such as data statistics, variogram, and trends. As illustrated in FIG. 8, the process of FIG. 6 breaks tied values in the input dataset, such that the data can be transformed to a normal distribution.

Figure 9:
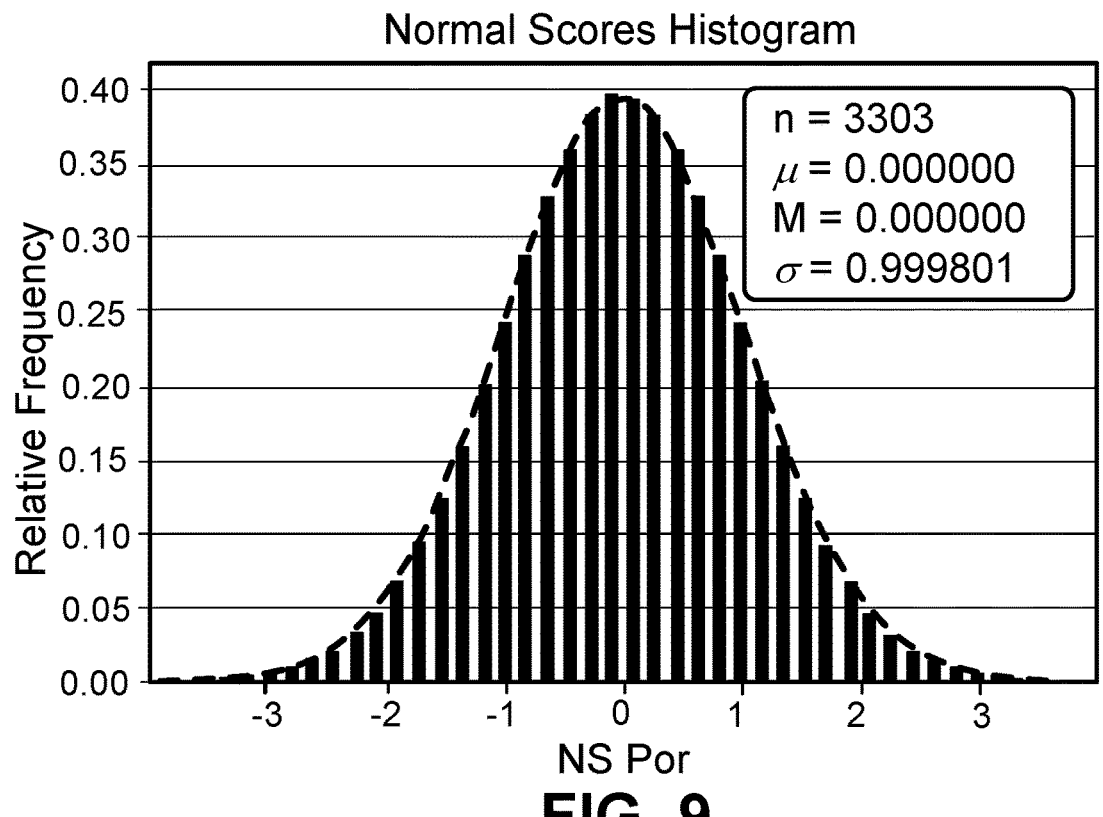
FIG. 9 illustrates an example histogram of transformed normal scores, in accordance with one or more implementations.

FIG. 9 illustrates an example histogram of transformed normal scores, in accordance with one or more implementations. The example de-spiked dataset of FIG. 8 was readily transformed to a normal distribution using the process illustrated and described in more detail with reference to FIG. 6 since no tied values present in the example de-spiked dataset of FIG. 8. The resulting normalized dataset of FIG. 9 contains 3303 values and has a mean of 6.883853328587104e-17, a median of 0.00, and a standard deviation of 0.9998014725407742. In some implementations, geostatistical algorithms are used to invoke multivariate Gaussian (MG) distribution for probabilistic prediction of continuous reservoir properties. The MG distribution is unique and enables the inference of conditional distributions. The MG distribution requires that the related univariate distributions must also be Gaussian. In some implementations, a quantile-to-quantile transform is used. The transform matches the p-quantile of the data distribution to the p-quantile of the standard normal distribution. Thus, the transform is a graphical one-to-one (rank preserving) transform.

Figure 10:
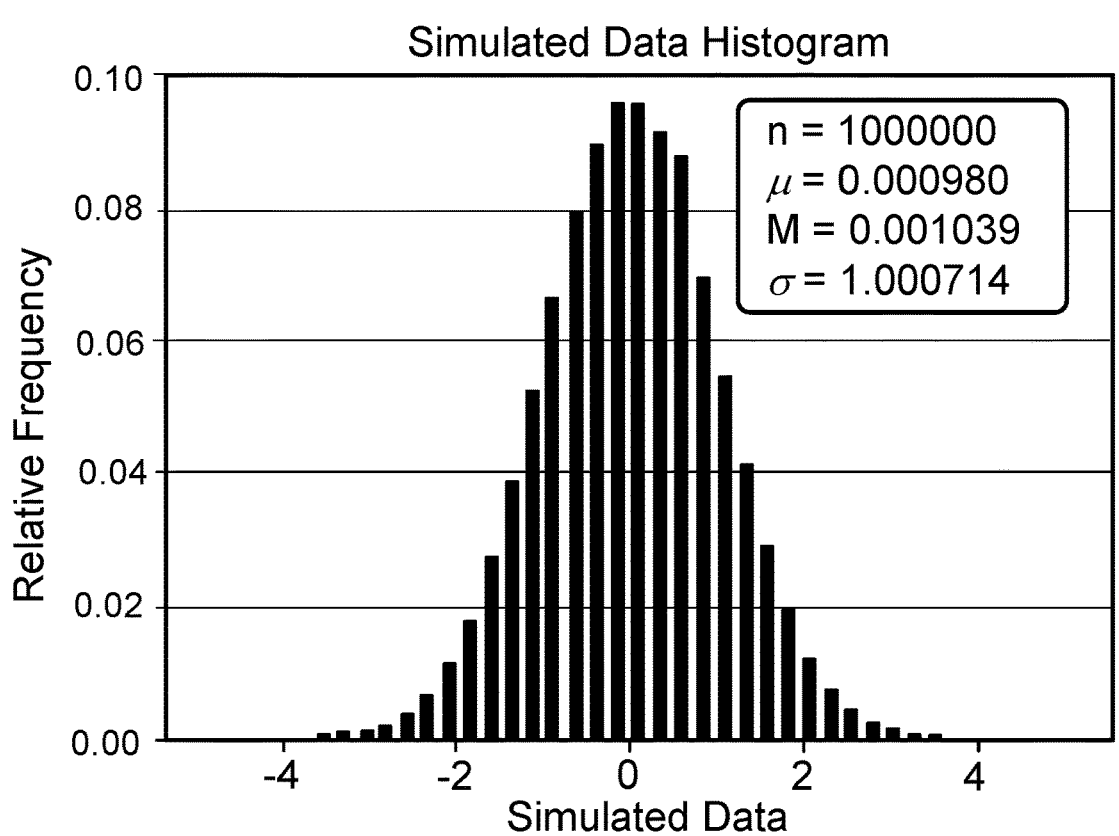
FIG. 10 illustrates an example histogram of a generated Gaussian model, in accordance with one or more implementations.

FIG. 10 illustrates an example histogram of a generated Gaussian model, in accordance with one or more implementations. The process illustrated and described in more detail with reference to step 316 of FIG. 3 was applied to the example transformed dataset of FIG. 9. The transformed dataset of FIG. 9 was randomly sampled from the standard normal distribution to mimic a simulated Sequential Gaussian model. The resulting histogram is shown in FIG. 10. The example histogram of the generated Gaussian model has 1,000,000 values, a mean of 0.0009804798874271865, a median of 0.0010388853595147823, and a standard deviation of 1.0007142511083926.

Figure 11:
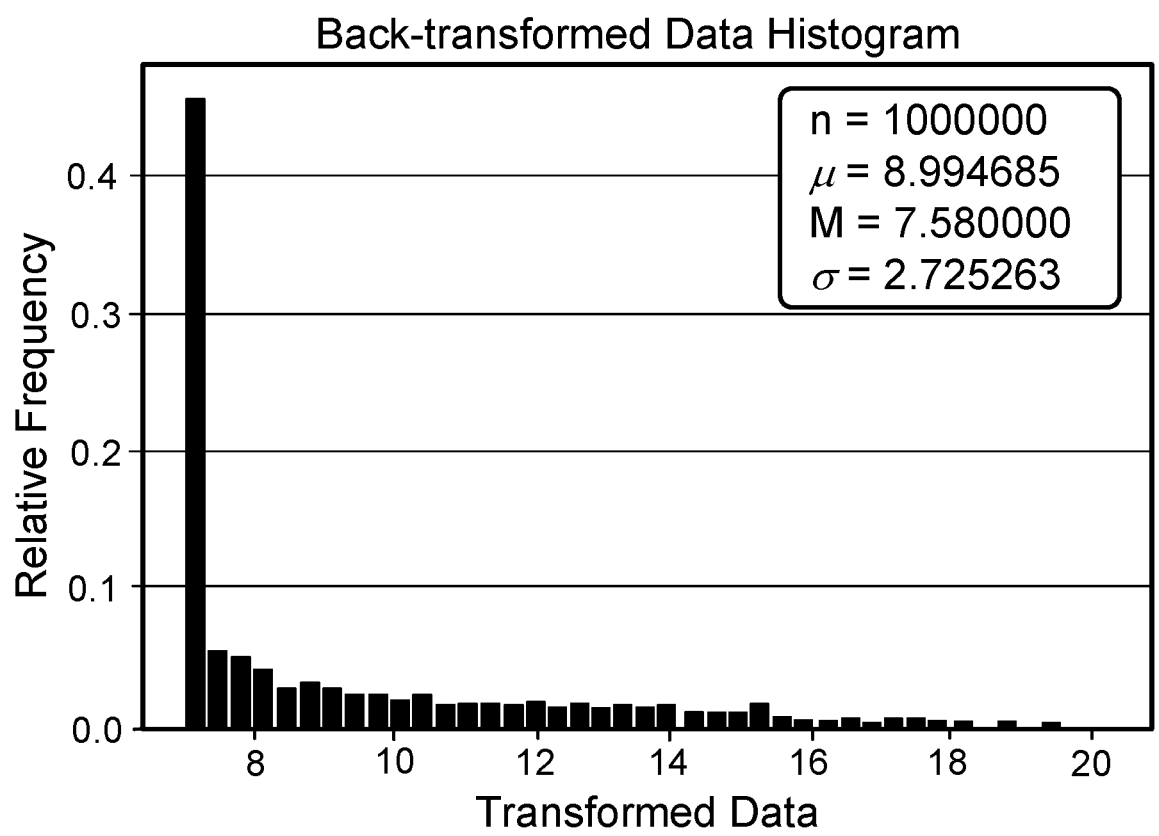
FIG. 11 illustrates an example histogram of a back-transformed dataset, in accordance with one or more implementations.

FIG. 11 illustrates an example histogram of a back-transformed dataset, in accordance with one or more implementations. The process of step 320 of FIG. 3 was applied to the generated Gaussian model of FIG. 10. The generated Gaussian model was thus transformed back to its original scale, to represent a simulated porosity model. The example back-transformed dataset (simulated porosity model) of FIG. 11 has 1,000,000 values, a mean of 8.99468485547978, a median of 7.58, and a standard deviation of 2.725263337624143. In comparison, the original dataset (see FIG. 7) has a mean of 8.990732667272177, a median of 7.58, and a standard deviation of 2.722295897243374. Thus, the mean, median, and standard deviation of the input dataset are all optimally reproduced. The shape of the histogram in FIG. 11 also matches that of FIG. 7. The disclosed implementations thus address the challenge of statistical reproduction (especially mean) and histogram reproduction when the percentage of tied values in the input dataset is large. Compared to traditional methods, the mean reproduction precision changes from the second decimal place to the third decimal place. For a large oilfield, this results in millions of barrels of reserve differences.

FIG. 12 illustrates a process for coordinate-related despiking of hydrocarbon reservoir data, in accordance with one or more implementations. In some implementations, the process is performed by the computer system illustrated and described in more detail with reference to FIG. 13.

In step 1204, the computer system receives multiple datapoints of a geomechanical property of a hydrocarbon reservoir modeled by a three-dimensional (3D) grid. Each datapoint corresponds to 3D coordinates of the 3D grid. For example, a porosity distribution can be used. Geostatistical algorithms can use a Gaussian distribution of multiple datapoints of the geomechanical property of a hydrocarbon reservoir for probabilistic prediction of continuous reservoir properties. The probabilistic prediction of continuous reservoir properties can be used for constructing, for example, a stochastic porosity model to an amount of the OOIP during a reservoir exploration stage.

In step 1208, for each datapoint, the computer system aggregates the datapoint with a noise component N generated using the 3D coordinates [I, J, K] corresponding to the datapoint. In some implementations, each of a mean, a standard deviation, and a variogram of the datapoints are unchanged by the aggregation of the datapoints with the noise component. The computer system is enabled to generate the noise component using a column index, a row index, and a layer index of the 3D coordinates of the 3D grid. In some implementations, the computer system converts the datapoints to a 64-bit double-precision floating point format prior to aggregating each datapoint with the noise component.

In step 1212, the computer system determines that the aggregated datapoint is unique to the multiple datapoints. In some implementations, generating the noise component includes multiplying, by the computer system, the column index, the row index, and the layer index with random coefficients selected to avoid matching values of the column index, the row index, and the layer index.

In step 1216, the computer system performs a transform on the multiple datapoints for Gaussian simulation. In some implementations, performing the transform includes ranking, by the computer system, each datapoint with a rank within a Gaussian distribution. The computer system assigns each datapoint to a value of the geomechanical property based on the rank. SGS refers to a procedure that uses the Kriging mean and variance to generate a Gaussian field, which transforms the original dataset to normal scores having zero mean and a unit variance. When the original dataset contains tied values, the original dataset cannot be transformed to a normal distribution. The process shown in FIG. 12 thus de-spikes the tied values and creates a normal distribution to satisfy the SGS algorithm requirement. The process of FIG. 12 is operable for an input dataset containing any number of tied values. Various SGS algorithms can be applied in the process of FIG. 12.

In step 1220, a display device 1324 of the computer system generates a graphical representation of the geomechanical property of the hydrocarbon reservoir based on the Gaussian simulation of the transformed datapoints. An example graphical representation is illustrated and described in more detail with reference to FIG. 11. An example display device 1324 is illustrated and described in more detail with reference to FIG. 13. The input dataset is thus first converted to a 64-bit floating point format, and a 64-bit noise component is added to each original datapoint. The despiked dataset is then converted to normal scores, and used as input for SGS. After simulation, the SGS model is finally transformed back to its original scale, and also to its original data precision.

Figure 13:
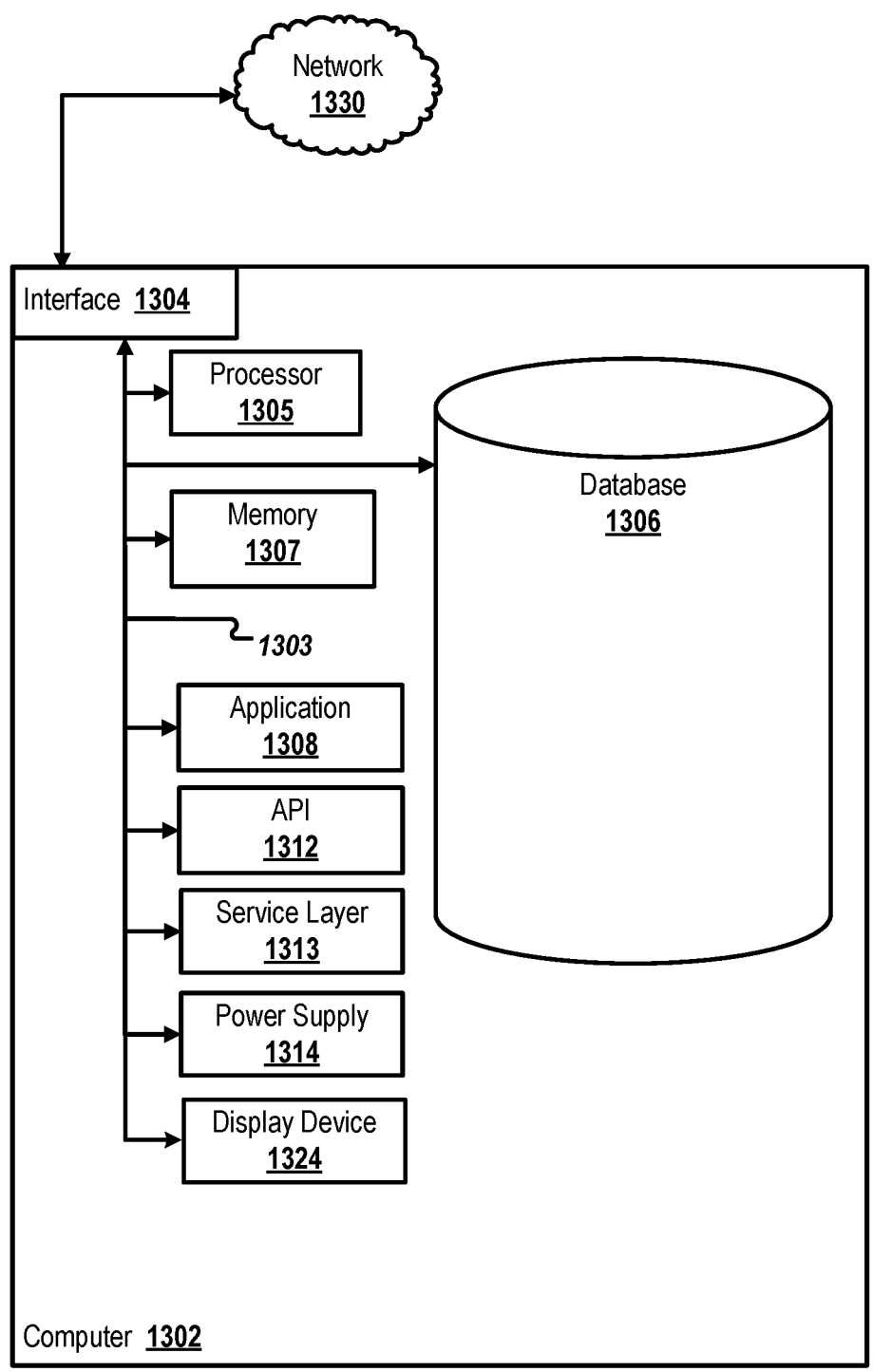
FIG. 13 illustrates an example computer system, in accordance with one or more implementations.

FIG. 13 illustrates an example computer system, in accordance with one or more implementations. In the example implementation, the computer system is a special purpose computing device. The special-purpose computing device is hard-wired or includes digital electronic devices such as one or more application-specific integrated circuits (ASICs) or field programmable gate arrays (FPGAs) that are persistently programmed to perform the techniques herein, or can include one or more general purpose hardware processors programmed to perform the techniques pursuant to program instructions in firmware, memory, other storage, or a combination. Such special-purpose computing devices can also combine custom hard-wired logic, ASICs, or FPGAs with custom programming to accomplish the techniques. In various embodiments, the special-purpose computing devices are desktop computer systems, portable computer systems, handheld devices, network devices or any other device that incorporates hard-wired and/or program logic to implement the techniques.

In an embodiment, the computer system includes a bus 1302 or other communication mechanism for communicating information, and one or more computer hardware processors 1308 coupled with the bus 1302 for processing information. The hardware processors 1308 are, for example, general-purpose microprocessors. The computer system also includes a main memory 1306, such as a random-access memory (RAM) or other dynamic storage device, coupled to the bus 1302 for storing information and instructions to be executed by processors 1308. In one implementation, the main memory 1306 is used for storing temporary variables or other intermediate information during execution of instructions to be executed by the processors 1308. Such instructions, when stored in non-transitory storage media accessible to the processors 1308, render the computer system into a special-purpose machine that is customized to perform the operations specified in the instructions.

In an embodiment, the computer system further includes a read only memory (ROM) 1310 or other static storage device coupled to the bus 1302 for storing static information and instructions for the processors 1308. A storage device 1312, such as a magnetic disk, optical disk, solid-state drive, or three-dimensional cross point memory is provided and coupled to the bus 1302 for storing information and instructions.

In an embodiment, the computer system is coupled via the bus 1302 to a display 1324, such as a cathode ray tube (CRT), a liquid crystal display (LCD), plasma display, light emitting diode (LED) display, or an organic light emitting diode (OLED) display for displaying information to a computer user. An input device 1314, including alphanumeric and other keys, is coupled to bus 1302 for communicating information and command selections to the processors 1308. Another type of user input device is a cursor controller 1316, such as a mouse, a trackball, a touch-enabled display, or cursor direction keys for communicating direction information and command selections to the processors 1308 and for controlling cursor movement on the display 1324. This input device typically has two degrees of freedom in two axes, a first axis (e.g., x-axis) and a second axis (e.g., y-axis), that allows the device to specify positions in a plane.

According to one embodiment, the techniques herein are performed by the computer system in response to the processors 1308 executing one or more sequences of one or more instructions contained in the main memory 1306. Such instructions are read into the main memory 1306 from another storage medium, such as the storage device 1312. Execution of the sequences of instructions contained in the main memory 1306 causes the processors 1308 to perform the process steps described herein. In alternative embodiments, hard-wired circuitry is used in place of or in combination with software instructions.

The term "storage media" as used herein refers to any non-transitory media that store data and/or instructions that cause a machine to operate in a specific fashion. Such storage media includes non-volatile media and/or volatile media. Non-volatile media includes, for example, optical disks, magnetic disks, solid-state drives, or three-dimensional cross point memory, such as the storage device 1312. Volatile media includes dynamic memory, such as the main memory 1306. Common forms of storage media include, for example, a floppy disk, a flexible disk, hard disk, solid-state drive, magnetic tape, or any other magnetic data storage medium, a CD-ROM, any other optical data storage medium, any physical medium with patterns of holes, a RAM, a PROM, and EPROM, a FLASH-EPROM, NV-RAM, or any other memory chip or cartridge.

Storage media is distinct from but can be used in conjunction with transmission media. Transmission media participates in transferring information between storage media. For example, transmission media includes coaxial cables, copper wire and fiber optics, including the wires that include the bus 1302. Transmission media can also take the form of acoustic or light waves, such as those generated during radio-wave and infrared data communications.

In an embodiment, various forms of media are involved in carrying one or more sequences of one or more instructions to the processors 1308 for execution. For example, the instructions are initially carried on a magnetic disk or solid-state drive of a remote computer. The remote computer loads the instructions into its dynamic memory and send the instructions over a telephone line using a modem. A modem local to the computer system receives the data on the telephone line and use an infrared transmitter to convert the data to an infrared signal. An infrared detector receives the data carried in the infrared signal and appropriate circuitry places the data on the bus 1302. The bus 1302 carries the data to the main memory 1306, from which processors 1308 retrieves and executes the instructions. The instructions received by the main memory 1306 can optionally be stored on the storage device 1312 either before or after execution by processors 1308.

The computer system also includes a communication interface 1318 coupled to the bus 1302. The communication interface 1318 provides a two-way data communication coupling to a network link 1320 that is connected to a local network 1322. For example, the communication interface 1318 is an integrated service digital network (ISDN) card, cable modem, satellite modem, or a modem to provide a data communication connection to a corresponding type of telephone line. As another example, the communication interface 1318 is a local area network (LAN) card to provide a data communication connection to a compatible LAN. In some implementations, wireless links are also implemented. In any such implementation, the communication interface 1318 sends and receives electrical, electromagnetic, or optical signals that carry digital data streams representing various types of information.

The network link 1320 typically provides data communication through one or more networks to other data devices. For example, the network link 1320 provides a connection through the local network 1322 to a host computer 1324 or to a cloud data center or equipment operated by an Internet Service Provider (ISP) 1326. The ISP 1326 in turn provides data communication services through the world-wide packet data communication network now commonly referred to as the "Internet" 1328. The local network 1322 and Internet 1328 both use electrical, electromagnetic or optical signals that carry digital data streams. The signals through the various networks and the signals on the network link 1320 and through the communication interface 1318, which carry the digital data to and from the computer system, are example forms of transmission media.

The computer system sends messages and receives data, including program code, through the network(s), the network link 1320, and the communication interface 1318. In an embodiment, the computer system receives code for processing. The received code is executed by the processors 1308 as it is received, and/or stored in storage device 1312, or other non-volatile storage for later execution.

What is claimed is:

1. A method comprising:
   receiving, by a computer system, a plurality of datapoints of a geomechanical property of a hydrocarbon reservoir modeled by a three-dimensional (3D) grid, each datapoint of the plurality of datapoints corresponding to 3D coordinates of the 3D grid;
   for each datapoint of the plurality of datapoints, aggregating, by the computer system, the datapoint with a noise component generated using the 3D coordinates corresponding to the datapoint, wherein the plurality of datapoints is converted to a higher data precision to preserve an accuracy of the geomechanical property;
   determining, by the computer system, that the aggregated datapoint is unique to the plurality of datapoints at the higher data precision;
   performing, by the computer system, a transform on the plurality of datapoints at the higher data precision for Gaussian simulation; and
   generating, by a display device of the computer system, a graphical representation of the geomechanical property of the hydrocarbon reservoir based on the Gaussian simulation of the transformed plurality of datapoints.

2. The method of claim 1, wherein each of a mean, a standard deviation, and a variogram of the plurality of datapoints are unchanged by the aggregation of the plurality of datapoints with the noise component.

3. The method of claim 1, further comprising generating, by the computer system, the noise component using a column index, a row index, and a layer index of the 3D coordinates of the 3D grid.

4. The method of claim 3, wherein generating the noise component comprises multiplying, by the computer system, the column index, the row index, and the layer index with random coefficients selected to avoid matching values of the column index, the row index, and the layer index.

5. The method of claim 1, wherein performing the transform comprises:
   ranking, by the computer system, each datapoint of the plurality of datapoints with a rank within a Gaussian distribution; and
   assigning, by the computer system, each datapoint of the plurality of datapoints to a value of the geomechanical property based on the rank.

6. The method of claim 1, further comprising removing, by the computer system, the noise component prior to the Gaussian simulation to provide the geomechanical property at a plurality of locations of the hydrocarbon reservoir.

7. The method of claim 1, further comprising converting, by the computer system, the plurality of datapoints to a 64-bit double-precision floating point format prior to aggregating each datapoint with the noise component.

8. A non-transitory computer-readable storage medium storing instructions executable by one or more computer processors, the instructions when executed by the one or more computer processors cause the one or more computer processors to:
   receive a plurality of datapoints of a geomechanical property of a hydrocarbon reservoir modeled by a three-dimensional (3D) grid, each datapoint of the plurality of datapoints corresponding to 3D coordinates of the 3D grid;
   for each datapoint of the plurality of datapoints, aggregate the datapoint with a noise component generated using the 3D coordinates corresponding to the datapoint wherein the plurality of datapoints is converted to a higher data precision to preserve an accuracy of the geomechanical property;
   determine that the aggregated datapoint is unique to the plurality of datapoints at the higher data precision;
   perform a transform on the plurality of datapoints at the higher data precision for Gaussian simulation; and
   generate, by a display device of a computer system, a graphical representation of the geomechanical property of the hydrocarbon reservoir based on the Gaussian simulation of the transformed plurality of datapoints.

9. The non-transitory computer-readable storage medium of claim 8, wherein each of a mean, a standard deviation, and a variogram of the plurality of datapoints are unchanged by the aggregation of the plurality of datapoints with the noise component.

10. The non-transitory computer-readable storage medium of claim 8, wherein the instructions further cause the one or more computer processors to generate the noise component using a column index, a row index, and a layer index of the 3D coordinates of the 3D grid.

11. The non-transitory computer-readable storage medium of claim 10, wherein generating the noise component comprises multiplying, by the computer system, the column index, the row index, and the layer index with random coefficients selected to avoid matching values of the column index, the row index, and the layer index.

12. The non-transitory computer-readable storage medium of claim 8, wherein performing the transform comprises:
   ranking each datapoint of the plurality of datapoints with a rank within a Gaussian distribution; and
   assigning each datapoint of the plurality of datapoints to a value of the geomechanical property based on the rank.

13. The non-transitory computer-readable storage medium of claim 8, wherein the instructions further cause the one or more computer processors to remove the noise component prior to the Gaussian simulation to provide the geomechanical property at a plurality of locations of the hydrocarbon reservoir.

14. The non-transitory computer-readable storage medium of claim 8, wherein the instructions further cause the one or more computer processors to convert the plurality of datapoints to a 64-bit double-precision floating point format prior to aggregating each datapoint with the noise component.

15. A computer system comprising:
one or more computer processors; and
a non-transitory computer-readable storage medium storing instructions executable by the one or more computer processors, the instructions when executed by the one or more computer processors cause the one or more computer processors to:
receive a plurality of datapoints of a geomechanical property of a hydrocarbon reservoir modeled by a three-dimensional (3D) grid, each datapoint of the plurality of datapoints corresponding to 3D coordinates of the 3D grid;
for each datapoint of the plurality of datapoints, aggregate the datapoint with a noise component generated using the 3D coordinates corresponding to the datapoint, wherein the plurality of datapoints is converted to a higher data precision to preserve an accuracy of the geomechanical property;
determine that the aggregated datapoint is unique to the plurality of datapoints at the higher data precision;
perform a transform on the plurality of datapoints at the higher data precision for Gaussian simulation; and
generate, by a display device of the computer system, a graphical representation of the geomechanical property of the hydrocarbon reservoir based on the Gaussian simulation of the transformed plurality of datapoints.

16. The computer system of claim 15, wherein each of a mean, a standard deviation, and a variogram of the plurality of datapoints are unchanged by the aggregation of the plurality of datapoints with the noise component.

17. The computer system of claim 15, wherein the instructions further cause the one or more computer processors to generate the noise component using a column index, a row index, and a layer index of the 3D coordinates of the 3D grid.

18. The computer system of claim 17, wherein generating the noise component comprises multiplying, by the computer system, the column index, the row index, and the layer index with random coefficients selected to avoid matching values of the column index, the row index, and the layer index.

19. The computer system of claim 15, wherein performing the transform comprises:
ranking each datapoint of the plurality of datapoints with a rank within a Gaussian distribution; and
assigning each datapoint of the plurality of datapoints to a value of the geomechanical property based on the rank.

20. The computer system of claim 15, wherein the instructions further cause the one or more computer processors to remove the noise component prior to the Gaussian simulation to provide the geomechanical property at a plurality of locations of the hydrocarbon reservoir.

* * * * *